United States Patent
Liang et al.

(10) Patent No.: US 11,177,815 B2
(45) Date of Patent: Nov. 16, 2021

(54) TIMING ALIGNMENT SYSTEMS WITH GAP DETECTION AND COMPENSATION

(71) Applicant: Analog Devices International Unlimited Company, Limerick (IE)

(72) Inventors: Siwen Liang, Basingstoke (GB); Marlon Consuelo Maramba, Metro Manila (PH); Alberto Marinas, Valencia (ES)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/249,272

(22) Filed: Feb. 25, 2021

(65) Prior Publication Data

US 2021/0288653 A1  Sep. 16, 2021

Related U.S. Application Data

(60) Provisional application No. 62/989,064, filed on Mar. 13, 2020.

(51) Int. Cl.
*H03L 7/093* (2006.01)
*H03L 7/097* (2006.01)
*H03L 7/087* (2006.01)

(52) U.S. Cl.
CPC .............. *H03L 7/097* (2013.01); *H03L 7/087* (2013.01); *H03L 7/093* (2013.01)

(58) Field of Classification Search
CPC ....... H03L 7/087; H03L 7/089; H03L 7/0891; H03L 7/093; H03L 7/097
See application file for complete search history.

(56) References Cited

U.S. PATENT DOCUMENTS 6,256,362 B1 * 7/2001 Goldman ............. H03D 13/004
                                                          375/373
6,954,511 B2  10/2005 Tachimori
(Continued)

FOREIGN PATENT DOCUMENTS

CN   109375196 B   8/2019
DE   102017106076 B3   7/2018
(Continued)

OTHER PUBLICATIONS

Deleener et al. "A Delay Locked Loop for Instantaneous Time-Of Flight Sensing based on a CMOS Demodulation Detector" dated Jan. 7, 2016, in 4 pages.

*Primary Examiner* — Patrick O Neill
(74) *Attorney, Agent, or Firm* — Knobbe, Martens, Olson & Bear, LLP

(57) ABSTRACT

Provided herein are gap detection and compensation schemes for timing alignment systems. In certain embodiments, a timing alignment system includes a detector that generates one or more loop control signals based on comparing a reference clock signal to a feedback clock signal, a loop filter having a loop voltage that is adjusted based on the one or more loop control signals, and a gap detection and compensation circuit that processes the one or more loop control signals to detect a gap in at least one of the reference clock signal or the feedback clock signal. In response to detecting the gap, the gap detection and compensation circuit modifies the one or more loop control signals to provide an adjustment to the loop voltage.

20 Claims, 8 Drawing Sheets

(56) References Cited

U.S. PATENT DOCUMENTS

| | | | |
|---|---|---|---|
| 7,003,065 B2 * | 2/2006 | Homol | H03L 7/0891 327/10 |
| 7,012,248 B2 | 3/2006 | Paschalidis | |
| 7,308,065 B2 | 12/2007 | Donnelly et al. | |
| 7,636,150 B1 | 12/2009 | Mccauley et al. | |
| 7,859,313 B2 * | 12/2010 | Chien | H03L 7/10 327/18 |
| 8,502,578 B2 | 8/2013 | Hatano et al. | |
| 8,625,080 B2 | 1/2014 | Heizmann et al. | |
| 9,109,888 B2 | 8/2015 | Korekado et al. | |
| 9,281,829 B2 | 3/2016 | Allan et al. | |
| 9,692,427 B2 | 6/2017 | Allan et al. | |
| 10,054,675 B2 | 8/2018 | Barnes | |
| 10,268,164 B2 | 4/2019 | Tsutsumi et al. | |
| 10,401,798 B2 | 9/2019 | Sudo et al. | |
| 10,473,769 B2 | 11/2019 | Shinozuka et al. | |
| 10,596,964 B2 | 3/2020 | Nihei et al. | |
| 10,678,190 B2 | 6/2020 | Suto | |
| 2019/0033431 A1 | 1/2019 | Haneda et al. | |
| 2019/0178995 A1 | 6/2019 | Tsai et al. | |
| 2020/0088875 A1 | 3/2020 | Sato et al. | |

FOREIGN PATENT DOCUMENTS

| | | | |
|---|---|---|---|
| JP | | 5507053 B2 | 5/2014 |
| WO | WO 2020/129954 A1 | | 6/2020 |

* cited by examiner

TIMING ALIGNMENT SYSTEMS WITH GAP DETECTION AND COMPENSATION

CROSS-REFERENCE TO RELATED APPLICATIONS

The present application claims priority to U.S. Provisional Patent Application No. 62/989,064, filed Mar. 13, 2020, and titled "TIMING ALIGNMENT SYSTEMS WITH GAP DETECTION AND COMPENSATION," the entirety of which is hereby incorporated herein by reference.

FIELD OF THE DISCLOSURE

Embodiments of the invention relate to electronic systems, and more particularly to, timing alignment systems.

BACKGROUND

Timing alignment systems are used to in a wide variety of applications to align the timing of an output signal to timing of an input signal. For example, timing alignment systems can be used to align the phase and/or frequency of the output signal to the input signal.

Timing alignments systems can include one or more timing feedback loops. One type of timing feedback loop is a delay locked loop (DLL), which uses feedback to set a delay of a controllable delay line to lock the output signal to the input signal. Another type of timing feedback loop is a phase locked loop (PLL), which uses feedback to set an oscillation frequency of a controllable oscillator to lock the output signal to the input signal.

SUMMARY OF THE DISCLOSURE

Timing alignment systems with gap detection and compensation are provided. In certain embodiments, a timing alignment system includes a detector that generates one or more loop control signals based on comparing a reference clock signal to a feedback clock signal, a loop filter having a loop voltage that is adjusted based on the one or more loop control signals, and a gap detection and compensation circuit that processes the one or more loop control signals to detect a gap in at least one of the reference clock signal or the feedback clock signal. In response to detecting the gap, the gap detection and compensation circuit modifies the one or more loop control signals to provide an adjustment to the loop voltage. Thus, gaps that would otherwise perturb the operation of the timing alignment system are detected and compensated for. For instance, gaps can be detected in a pulse train serving as a timing reference signal to a timing feedback loop, and the loop voltage of the timing feedback loop adjusted to compensate for the gap.

In one aspect, a timing alignment system with gap detection and compensation is provided. The timing alignment system includes a detector configured to generate one or more loop control signals based on comparing a reference clock signal to a feedback clock signal, a loop filter having a loop voltage that is adjusted based on the one or more loop control signals, and a gap detection and compensation circuit configured to process the one or more loop control signals to detect a gap in at least one of the reference clock signal or the feedback clock signal, and to modify the one or more loop control signals to provide an adjustment to the loop voltage in response to detecting the gap.

In another aspect, a method of gap detection and compensation in a timing alignment system is provided. The method includes generating one or more loop control signals based on comparing a reference clock signal to a feedback clock signal using a detector, adjusting a loop voltage of a loop filter based on the one or more loop control signals, and processing the one or more loop control signals using a gap detection and compensation circuit to detect a gap in at least one of the reference clock signal or the feedback clock signal, and modifying the one or more loop control signals to provide an adjustment to the loop voltage in response to detecting the gap.

In another aspect, a time of flight system is provided. The time of flight system includes a receiver configured to provide a reference clock signal, a delay-locked loop configured to generate an output clock signal based on the reference clock signal, and a driver circuit configured to generate a driver signal based on the output clock signal. The delay-locked loop includes a detector configured to generate one or more loop control signals based on comparing the reference clock signal to a feedback clock signal, a loop filter having a loop voltage that is adjusted based on the one or more loop control signals, a gap detection and compensation circuit configured to process the one or more loop control signals to detect a gap in at least one of the reference clock signal or the feedback clock signal, and to modify the one or more loop control signals to provide an adjustment to the loop voltage in response to detecting the gap.

DETAILED DESCRIPTION

Figure 1A:
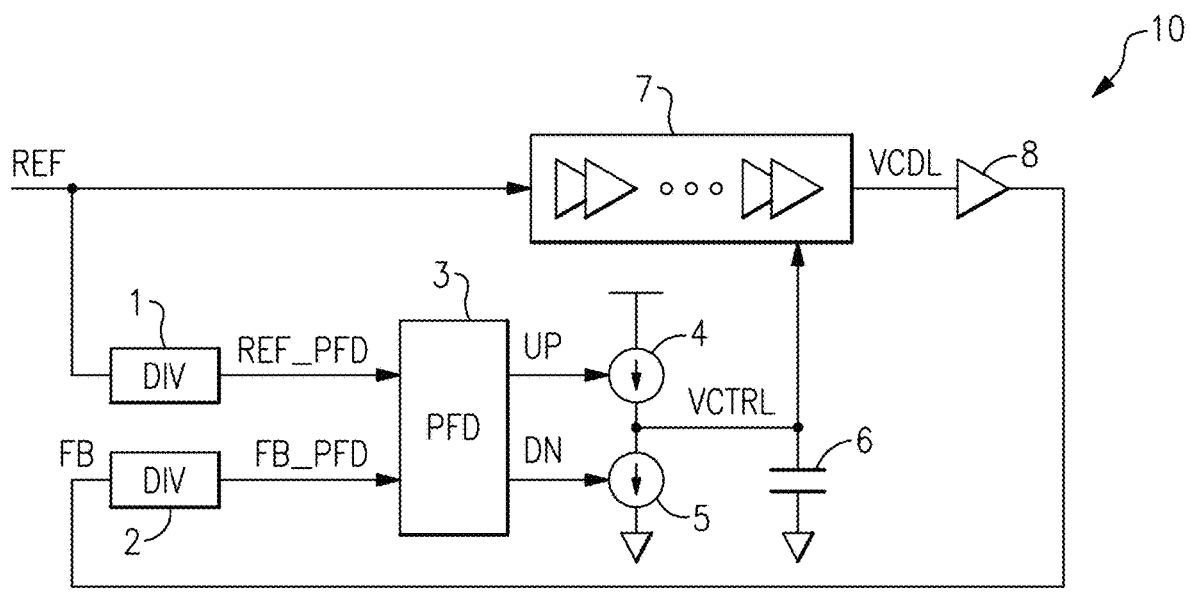
FIG. 1A is a schematic diagram of one implementation of a delay locked loop (DLL).

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Timing alignment systems can include one or more timing feedback loops, such as delay locked loops (DLLs) and/or phase locked loops (PLLs). Such timing feedback loops are often chosen as the core circuitry to achieve accurate timing alignment.

In some applications, there are some intentionally introduced gaps in a pulse train serving as a timing reference signal to a timing feedback loop. The gaps can be either small, for example a few signal periods, or large, for example a long signal processing period. The timing alignment system can be specified to keep the loop maintained locked or almost locked so that when the pulse train resumes sometime later, the loop starts from a locked point or close to locked point.

Provided herein are gap detection and compensation schemes for timing alignment systems. In certain embodiments, a timing alignment system includes a detector that generates one or more loop control signals based on comparing a reference clock signal to a feedback clock signal, a loop filter having a loop voltage that is adjusted based on the one or more loop control signals, and a gap detection and compensation circuit that processes the one or more loop control signals to detect a gap in at least one of the reference clock signal or the feedback clock signal. In response to detecting the gap, the gap detection and compensation circuit modifies the one or more loop control signals to provide an adjustment to the loop voltage.

Thus, gaps that would otherwise perturb the operation of the timing alignment system are detected and compensated for. For instance, gaps can be detected in a pulse train serving as a timing reference signal to a timing feedback loop, and the loop voltage of the timing feedback loop adjusted to compensate for the gap. The gap detection and compensation schemes can be used in a wide variety of loops, including those using a phase-frequency detector (PFD) for controlling a charge pump that provides a current to the loop filter.

FIG. 1A is a schematic diagram of one implementation of a delay locked loop (DLL) 10. The DLL 10 includes a reference divider 1, a feedback divider 2, a phase frequency detector (PFD) 3, an up current source 4, a down current source 5, a loop capacitor 6, a voltage controlled delay line 7, an output buffer 8.

As shown in FIG. 1A, a reference signal REF is provided to the voltage controlled delay line 7 and to the reference divider 1, which divides the reference signal REF to generate a PFD reference signal REF_PFD. The PFD 3 compares the PFD reference signal REF_PFD to a PFD feedback signal FB_PFD to generate an up signal UP for controlling the up current source 4 and a down signal DN for controlling the down current source 5. The up current source 4 and the down current source 5 provide currents to the loop capacitor 6 to thereby set a control voltage VCTRL (also referred to herein as a loop voltage) that sets a delay of the voltage controlled delay line 7. The voltage controlled delay line 7 outputs a delayed output signal VCDL, which is buffered by the output buffer 8 to generate a feedback signal FB. The feedback divider 2 divides the feedback signal FB to generate the PFD feedback signal FB_PFD.

Figure 1B:
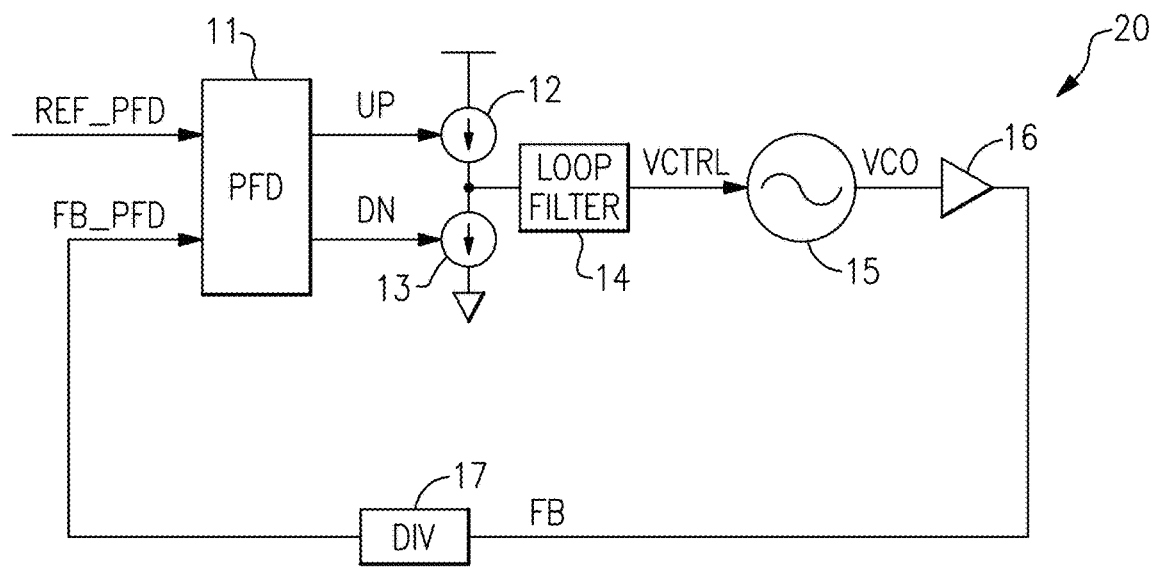
FIG. 1B is a schematic diagram of one implementation of a phase locked loop (PLL).

FIG. 1B is a schematic diagram of one implementation of a phase locked loop (PLL) 20. The PLL 20 includes a PFD 11, an up current source 12, a down current source 13, a loop filter 14, a voltage controlled oscillator 15, an output buffer 16, and a feedback divider 17.

As shown in FIG. 1B, the PFD 11 compares a PFD reference signal REF_PFD (which is provided from a reference divider, in certain implementations) to a PFD feedback signal FB_PFD to generate an up signal UP for controlling the up current source 12 and a down signal DN for controlling the down current source 13. The up current source 12 and the down current source 13 provide currents to the loop filter 14 to thereby set a control voltage VCTRL (also referred to herein as a loop voltage) that sets an oscillation frequency of the voltage controlled oscillator 15. The voltage controlled oscillator 15 outputs an oscillator output signal VCO, which is buffered by the output buffer 16 to generate a feedback signal FB. The feedback divider 17 divides the feedback signal FB to generate the PFD feedback signal FB_PFD.

With reference to FIGS. 1A and 1B, DLLs and/or PLLs are popular circuitry in systems where accurate timing alignment performance is desired. For example, FIG. 1A depicts an example implementation of a type-I DLL, while FIG. 1B depicts an example implementation of a type-II PLL.

The DLL 10 of FIG. 1A and the PLL 20 of FIG. 1B illustrate examples of timing feedback loops that can be implemented with gap detection and compensation in accordance with the teachings herein. However, the teachings herein are also applicable to other implementations of timing alignment circuitry including, but not limited to, other implementations of DLLs and PLLs, such as DLLs and PLLs of other types.

A timing feedback loop receives an incoming clock signal serving as a timing reference signal to a detector (for instance, a PFD). In certain applications, the incoming clock signal is a continuous burst of signal, although the signal itself could be phase and/or frequency modulated. In other applications, however, intentional gaps are introduced in the pulse train, with the length of the gap depending on application. The timing feedback loop reacts to the gaps if compensation for the gap is not provided for.

Figure 2A:
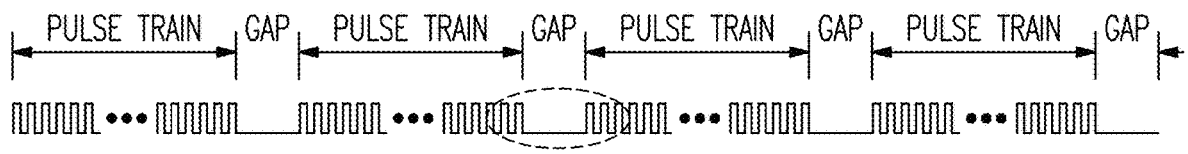
FIG. 2A is a timing diagram depicting one example of a pulse train with gaps.
Figure 2B:
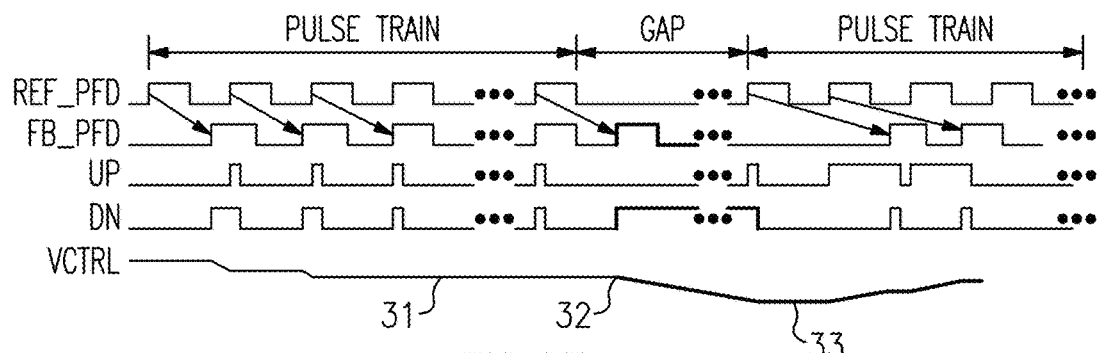
FIG. 2B is one example of a timing diagram for a timing alignment system in response to a pulse train with gaps.
Figure 2C:
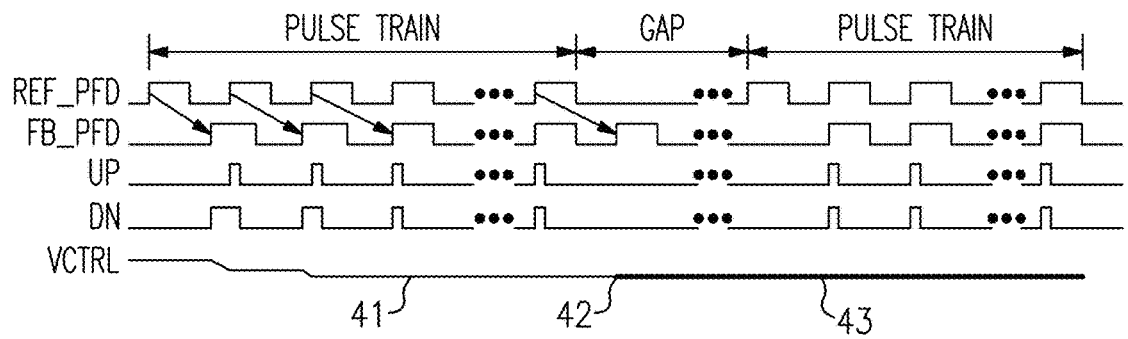
FIG. 2C is one example of a timing diagram for a timing alignment system in response to a pulse train with gaps.

FIG. 2A is a timing diagram depicting one example of a pulse train with gaps. FIG. 2B is one example of a timing diagram for a timing alignment system in response to a pulse train with gaps. FIG. 2C is another example of a timing diagram for a timing alignment system in response to a pulse train with gaps. The timing diagrams of FIGS. 2A to 2C are depicted for the example of the DLL 10 of FIG. 1A.

Since the FB signal is the delayed version of the REF signal, an additional unwanted down signal DN is generated by the PFD in response to the REF signal stopping at some point. Without awareness of the disappearance of the REF signal, the charge pump would continuously discharge the loop filter until the next REF signal arrives again.

Depending on the configurations of the charge pump current, loop filter capacitance, and the length of the gap, this undesired operation could cause the loop to significantly deviate from a locked condition. Such a deviation can be associated with a lengthy re-lock transient or even can result in a false locking problem when the REF signal arrives again, which can be intolerable to the system.

An example of such a scenario is depicted in FIG. 2B, which includes a locked region 31 in which the loop is locked, a discharge region 32 in which an unwanted down pulse DN discharges the loop capacitor, and unlocked region 33 in which a subsequent burst suffers from long re-locking transient or false locking.

It is desirable for the loop of a timing alignment system to not be affected by the gap, or in other words, for the loop to be maintained in the locked condition with little to no additional complexity and cost. An example of such desirable behavior is depicted in FIG. 2C, in which the VCTRL voltage is substantially constant during a gap. For example, FIG. 2C includes a locked region 41 in which the loop is locked, an override region 42 in which an additional feedback pulse is ignored, and a near locked region 43 in which a subsequent burst starts from an almost locked position.

Figure 3:
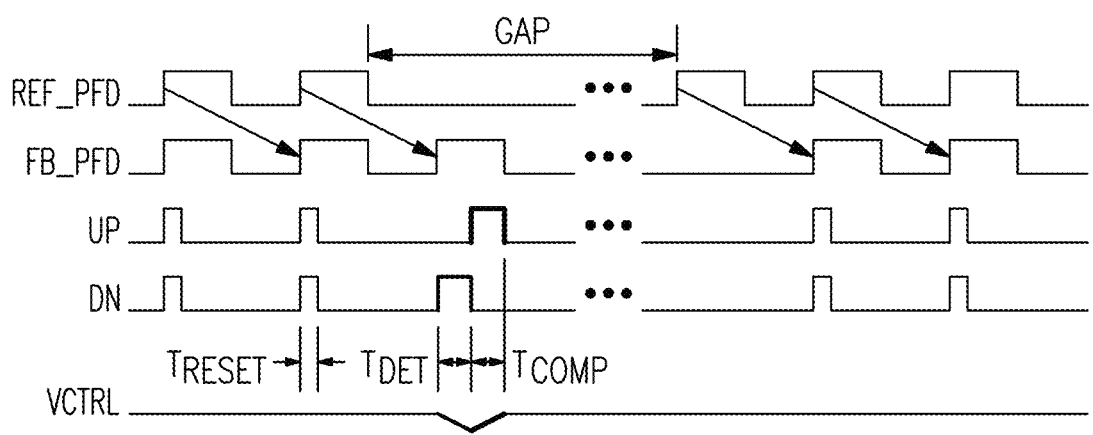
FIG. 3 is one example of a timing diagram for a timing alignment system with gap detection and compensation.

FIG. 3 is one example of a timing diagram for a timing alignment system with gap detection and compensation.

The timing diagram of FIG. 3 depicts operation of one embodiment of a DLL operating in response to a pulse train with gaps. Such a DLL can implemented with very low cost and operate with robust performance by maintaining the loop in locked or almost locked condition during the gap period between incoming signal pulse trains.

As shown in FIG. 3, when the loop is locked (during normal operation) REF_PFD and FB_PFD are phase aligned, and the PFD outputs UP and DN are also aligned. The pulse width of the up signal UP and down signal DN is $T_{RESET}$, which is desirable to avoid a dead zone in the PFD.

With respect to detection of a gap, consider an operating scenario of a locked DLL in which REF_PFD disappears at some point in time. Because the DLL is a locked, the last REF_PFD pulse propagates to cause a corresponding change in the FB_PFD pulse after a signal period delay. This FB_PFD rising edge triggers an additional rising edge of the down signal DN, which starts discharging the VCTRL voltage. Since there is no corresponding REF_PFD signal anymore, this down signal DN cannot be brought back to zero.

The phenomenon of the down signal DN being extra-long after the loop is locked is a sign of a missing PFD reference signal REF_PFD, which can be detected and then used to trigger a compensation operation.

In particular, after the gap is detected, compensation circuitry serves to bring the control voltage VCTRL back to a voltage level associated with lock. In one example, the compensation circuitry brings the down signal DN back to zero, and the resulting width of this undesired down signal pulse is $T_{DET}$. Additionally, the compensation circuitry generates an up signal UP to compensate the voltage drop, with the width of $T_{COMP}$ equal to $T_{DET}$. Although one example of detecting and compensating for a gap is provided, other implementations are possible.

In certain embodiments, after a gap is detected and compensated, a DLL or other timing feedback loop is put into a state (for instance, a reset of the PFD) that waits for the next incoming signal to activate the main loop again. The control signal for providing such a reset can be generated based on observing the up/down signals (UP/DN), one or more signals from the gap detection and compensation circuit, and/or other suitable signal(s). Resetting the detector aids in preventing the main loop from malfunctioning.

Figure 4A:
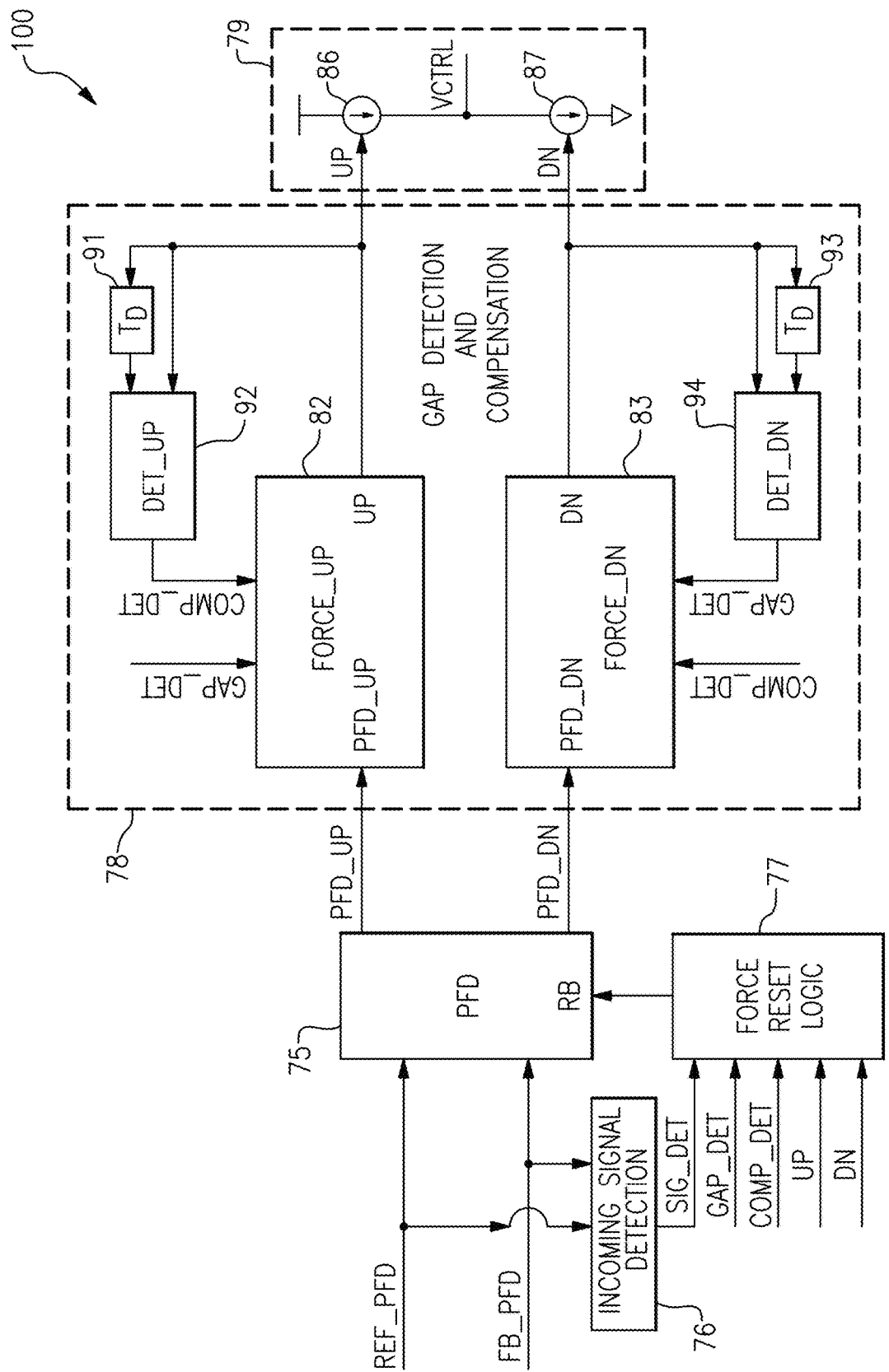
FIG. 4A is a schematic diagram of a portion of a timing alignment system with gap detection and compensation according to one embodiment.

FIG. 4A is a schematic diagram of a portion of a timing alignment system with gap detection and compensation according to one embodiment. The depicted timing alignment circuitry 100 includes a PFD 75, an incoming signal detection circuit 76, a force reset logic circuit 77, a gap detection and compensation circuit 78, and a charge pump 79 including an up current source 86 and a down current source 87.

In the illustrated embodiment, the gap detection and compensation circuit 78 includes an up forcing circuit 82, a down forcing circuit 83, a first delay circuit 91, an up detection circuit 92, a second delay circuit 93, and a down detection circuit 94.

The timing alignment circuitry 100 depicts an example architecture to implement gap detection and compensation. However, gap detection and compensation can be implemented in other ways.

In the illustrated embodiment, the up forcing circuit 82 is inserted between a first output of the PFD 75 and a control input to the charge pump's up current source 86, while the down forcing circuit 83 is inserted between a second output of the PFD 75 and a control input to the charge pump's down current source 87. As shown in FIG. 4A, the up forcing circuit 82 and the down forcing circuit 83 each receive a gap detection signal GAP_DET from the down detection circuit 94 and a compensation detection signal COMP_DET from the up detection circuit 92. The gap detection signal GAP_DET and compensation detection signal COMP_DET can be used to enable or disable the up forcing circuit 82 and the down forcing circuit 83 as well as to control compensation provided to a loop control voltage VCTRL.

When disabled, the up forcing circuit 82 passes the first PFD output PFD_UP to the up current source 86. Additionally, when disabled, the down forcing circuit 83 passes the second PFD output PFD_DN to the down current source 87.

However, when enabled, the up forcing circuit 82 controls the up current source 86 with an up override signal that can be different from the first PFD output PFD_UP. Likewise, when enabled, the down forcing circuit 83 controls the down current source 87 with a down override signal that can be different from the second PFD output PFD_DN. Such control can be based on digital logic operating on the compensation detection signal COMP_DET from the up detection circuit 92 and the gap detection signal GAP_DET from the down detection circuit 94.

As shown in FIG. 4A, the first delay circuit 91 delays the up signal UP such that the up detection circuit 92 is operable to sense an up signal UP of a long length (determined by a delay of the first delay circuit 91, which can be adjustable or controllable in some implementations). The up detection circuit 92 generates a detection compensation signal COMP_DET to indicate when an up signal UP of long length is observed.

The second delay circuit 93 delays the down signal DN such that the down detection circuit 94 is operable to sense a down signal DN of a long length (determined by a delay of the second delay circuit 93, which can be adjustable or controllable in some implementations). The down detection circuit 94 generates a gap detection signal GAP_DET (indicating that a gap is detected as determined by a down signal DN of long length), which in certain implementations is used to enable the up forcing circuit 82 and the down forcing circuit 83.

When the gap detection signal GAP_DET is enabled, the down forcing circuit 83 deactivates the down signal DN to turn off the down current source 87. Thus, the discharge of the control voltage VCTRL is stopped.

To compensate for the discharge arising from the gap, a compensating charging current is injected into the loop filter to thereby restore the control voltage VCTRL. In particular, the up signal UP is activated by the up forcing circuit 82, and the compensation detection signal COMP_DET is used to detect whether the compensating charging time has been reached. Once the compensation detection signal COMP_DET is activated, the up forcing circuit 82 deactivates the up signal UP.

Although one embodiment of gap detection and compensation is depicted, other implementations are possible.

The illustrated timing alignment circuitry 100 includes the incoming signal detection circuit 76 for generating a detection signal SIG_DET indicating that the incoming signal is observed. The timing alignment circuitry 100 further includes the force reset logic circuit 77 for processing the detection signal SIG_DET, the up signal UP, the down signal DN, the gap detection signal GAP_DET, and the gap compensation signal COMP_DET to generate a reset signal RB for the PFD 75.

By controlling timing of a reset to the PFD 75, malfunction of the timing alignment system's loop is prevented. For example, such a reset can put the timing feedback loop into a state that waits for the next incoming signal to activate the main loop again.

In certain embodiments herein, gap detection and compensation circuitry serves to generate control signals to properly control the flow of detector signals through a timing feedback loop. In certain implementations, the gap detection and compensation circuitry for the up and down paths should be balanced such that the additional up signal pulse and down signal pulses should result in as close as possible to zero net charge to the loop voltage VCTRL.

The teachings herein are application to a wide variety of timing feedback loops including, but not limited to, both PFD/charge pump type DLLs and PLLs.

Although certain timing diagrams depict an example of a frequency divider division ratio of 1, frequency divider's division ratio can be greater than one.

In certain embodiments herein, the gap detection and compensation circuitry operates with a decision-making delay, $T_D$, which is sufficiently long enough such that the GAP_DET is not triggered when up signal UP and/or down signal DN are still high during normal operation.

In certain implementations, gap detection and compensation circuitry serves one or more additional functions aside from gap detection and compensation, thereby sharing hardware resources and enhancing integration. For example, aside from gap detection and compensation, the gap detection and compensation circuitry could also be used as an error detection and recovery block. For example, both the up signal UP and down signal DN can be monitored by a detector and compensate whenever there is an excessive phase error due to an undesired event after the loop is locked.

For a DLL loop, gap detection and compensation can ensure that the loop is almost locked immediate when the missing signal is present again. However, for a PLL, gap detection and compensation brings the VCO frequency back to where it should be (frequency alignment), but the phase is not necessarily aligned. Therefore, the PLL is likely to experience a re-acquisition again, but benefit from a faster acquisition relative to a configuration without such compensation.

Figure 4B:
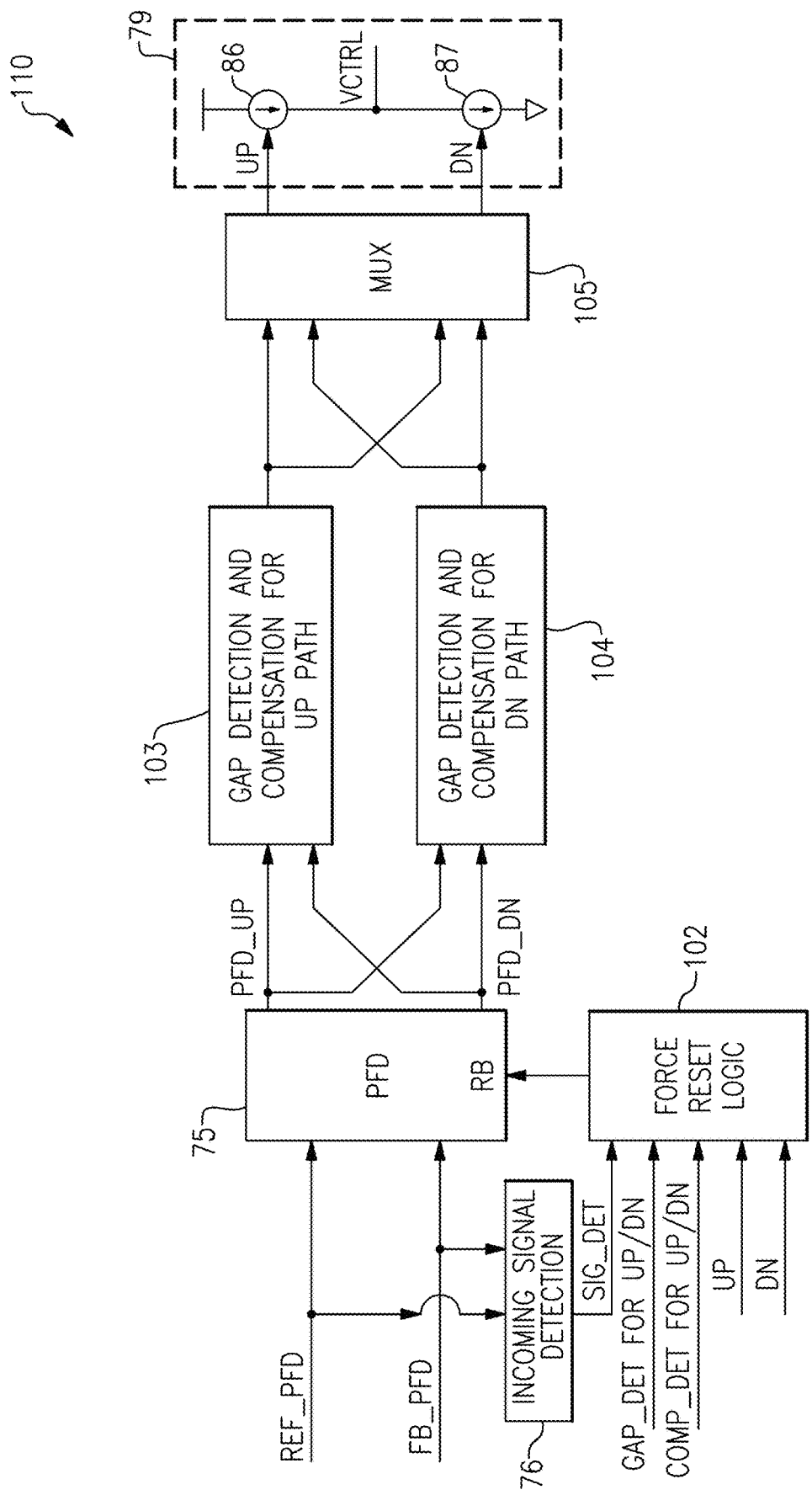
FIG. 4B is a schematic diagram of a portion of a timing alignment system with gap detection and compensation according to another embodiment.

FIG. 4B is a schematic diagram of a portion of a timing alignment system with gap detection and compensation according to another embodiment. The timing alignment circuitry 110 includes a PFD 75, an incoming signal detection circuit 76, a force reset logic circuit 102, an up gap detection and compensation circuit 103, a down gap detection and compensation circuit 104, a multiplexer 105, and a charge pump 79.

In the illustrated embodiment, the timing alignment circuitry 110 is implemented to detect for a gap present in either the reference signal REF_PFD or the feedback signal FBK_PFD. Furthermore, the multiplexer 105 is included for multiplexing the up signal path and down signal path. Thus, if a gap causes the down pulse DN to disrupt the control voltage VCTRL, the up pulse UP can be controlled to provide a subsequent pulse that compensates the control voltage VCTRL for the gap. Likewise, if a gap causes the up pulse UP to disrupt the control voltage VCTRL, the down pulse DN can be controlled to provide a subsequent pulse that compensates the control voltage VCTRL for the gap. Inclusion of the multiplexer 105 provides flexibility for facilitating such compensation for gaps present in either input to the PFD 75.

Additional details of the timing alignment circuitry 110 of FIG. 4B is similar to the timing alignment circuitry 100 of FIG. 4A.

Figure 5A:
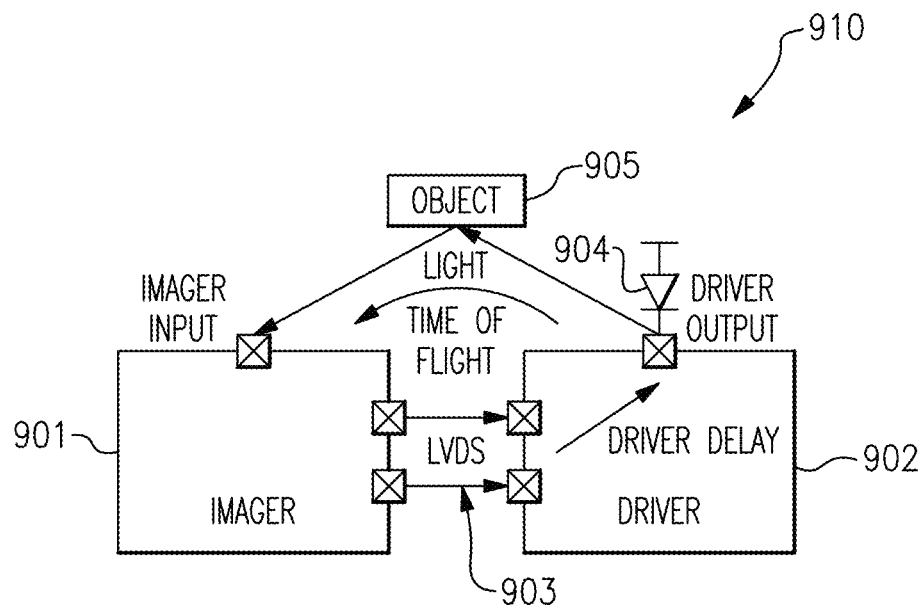
FIG. 5A is a schematic diagram of a time of flight system according to one embodiment.
Figure 5B:
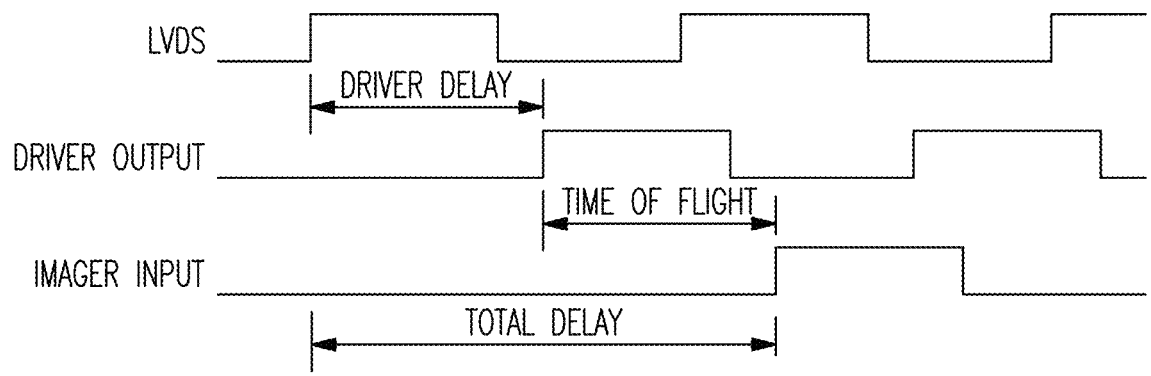
FIG. 5B is one example of a timing diagram for the time of flight system of FIG. 5A.

FIG. 5A is a schematic diagram of a time of flight system 910 according to one embodiment. FIG. 5B is one example of a timing diagram for the time of flight system 910 of FIG. 5A.

Time of flight (ToF) measurement techniques are attractive for a wide range of emerging 3D imaging applications including, but not limited to, facial recognition, augmented reality, machine vision, industrial automation and/or autonomous driving.

The time of flight system 910 of FIG. 5A includes a two-chip architecture including an imager chip 901 and a laser driver chip 902 connected by an interface 903 (low-voltage differential signaling or LVDS, in this example). The imager chip 901 serves as a master chip that sends a signal pulse (for instance, an LVDS signal) to the laser driver chip 902.

The laser driver chip 902 controls emission of light output (using light emitting element 904, in this example) to an object 905, and the reflected light arrives at the receiver of the imager chip 901 sometime later. The light emitting element 904 can correspond to a wide variety of light emitting components including, but not limited to, a laser emitting element such as a vertical-cavity surface-emitting laser (VCSEL).

The imager chip 901 then calculates the distance to the object 905 by measuring the time or phase difference between the transmitted LVDS signal and the reflected light, with knowledge of the speed of light. The "total delay" is the sum of the driver's own propagation delay and the actual time of flight. The driver delay is typically calibrated out for each part at a certain temperature and voltage. However, it is complicated and costly to calibrate its drift over temperature and voltage, reducing its market viability.

Figure 6:
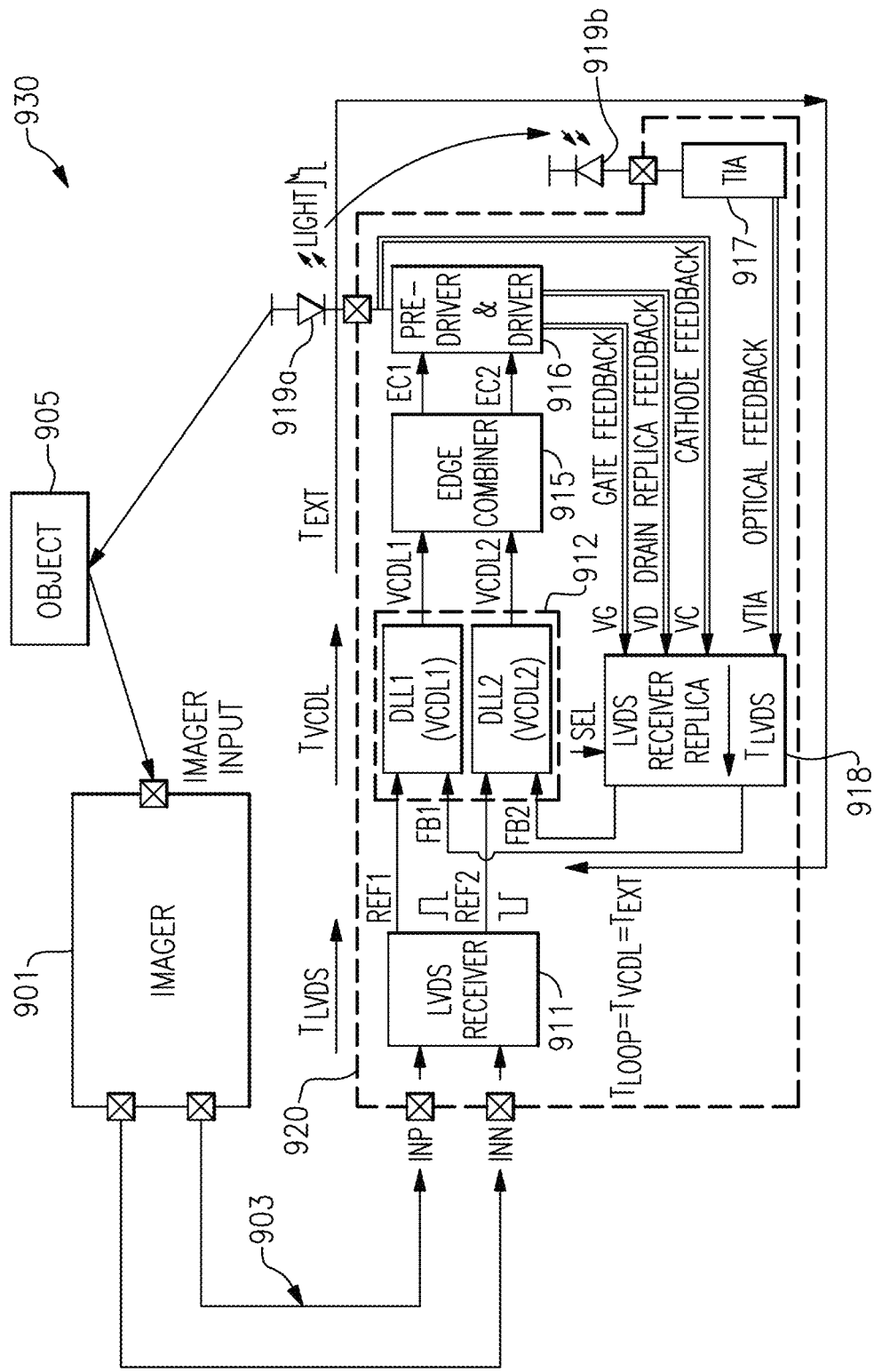
FIG. 6 is a schematic diagram of a time of flight system according to another embodiment.

FIG. 6 is a schematic diagram of a time of flight system 930 according to another embodiment. The time of flight system 930 of FIG. 6 includes an imager chip 901 and a laser driver chip 920 connected by an interface 903.

The time of flight system 930 of FIG. 6 is similar to the time of flight system of 910 of FIG. 5A except that the time of flight system 930 depicts a specific implementation of laser driver circuitry.

In particular, the laser driver chip 920 of FIG. 6 includes a receiver 911, a pair of DLLs 912, an edge combiner 915, a driver signal chain (pre-driver/driver circuitry) 916, a transimpedance amplifier (TIA) 917, and a replica receiver 918 operating on various feedback options (for instance, gate/drain replica/cathode/TIA). The laser driver chip 920 is coupled to a transmitting light element 919a and to a receiving light element 919b.

In the illustrated embodiment, the pair of DLLs 912 are used to align both the rising and falling edges of the output to the input signal, regardless if the signal itself is single-ended or differential. The loop forces the input signal (INP, INN) to be aligned with one of the selected feedback signals (VG, VD, VC, VTIA). In certain implementations, the laser driver chip 920 is further implemented with calibration for variation in one or more of the gate/drain replica/cathode/TIA nodes.

The pair of DLLs 912 operate as a dual DLL timing alignment system for controlling timing of the emission of light from the time of flight system 930. In certain implementations, a dual DLL timing alignment system is implemented in accordance with one or more of the gap detection and compensation schemes disclosed herein. For example, either or both of the depicted DLLs can be implemented with gap detection and compensation.

Although FIG. 6 depicts a dual DLL timing alignment system for a time of flight system, the teachings herein are also applicable to other timing alignment systems.

Figure 7:
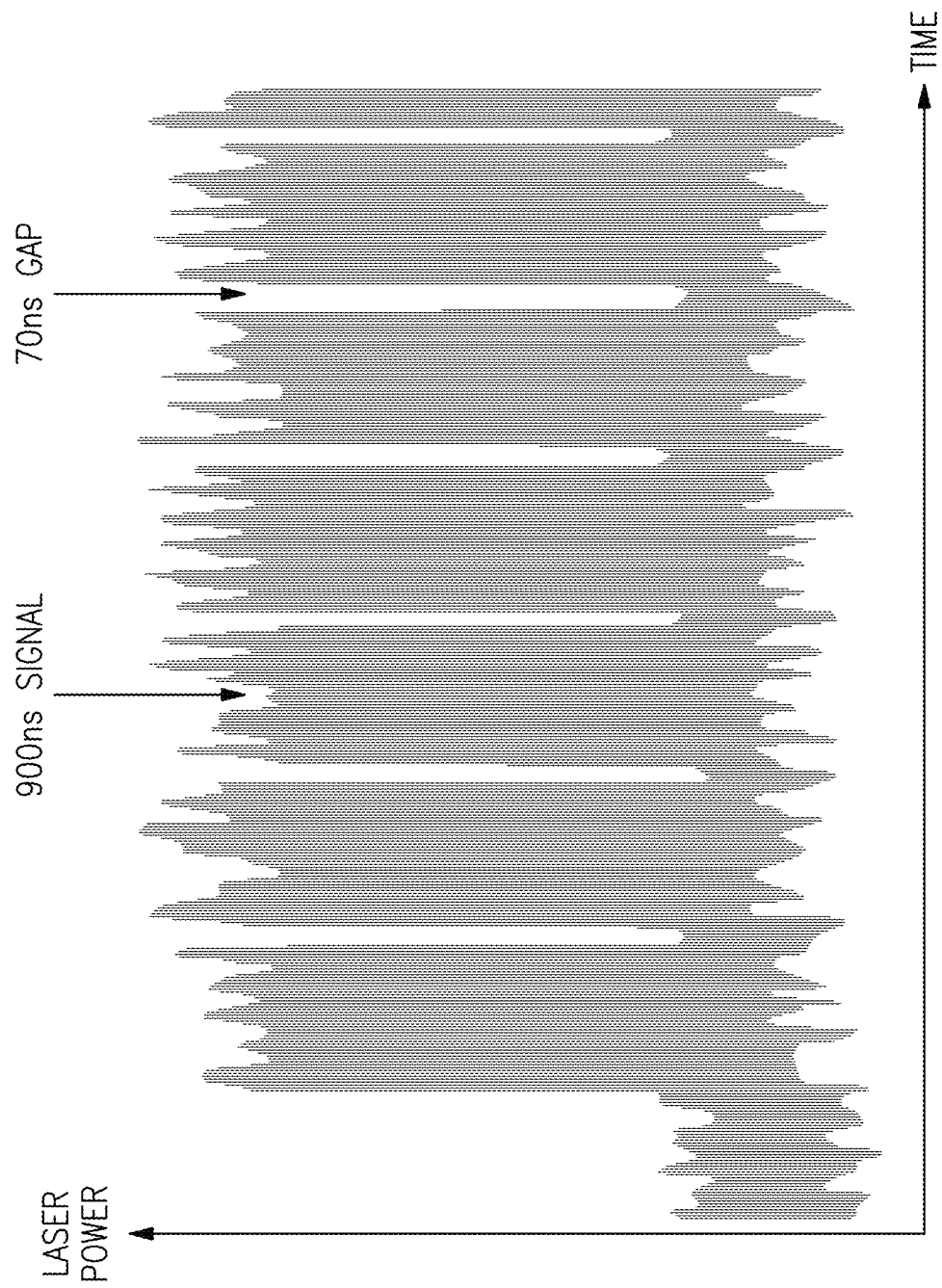
FIG. 7 is a graph of one example of laser power versus time for a time of flight system.

FIG. 7 is a graph of one example of laser power versus time for a time of flight system. For example, the graph depicts one example of laser power versus time for a timing of flight system implemented in accordance with the embodiments of FIGS. 5A-6.

As shown in FIG. 7, the laser power includes signal periods followed by gaps. When using a DLL or other timing alignment system for controlling timing alignment of light pulses, the gaps can introduce instability. By implementing the DLL or other timing alignment system in accordance with the teachings herein, such gaps can be detected and compensated for.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, automotive, radar, and aerospace applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A timing alignment system with gap detection and compensation, the timing alignment system comprising:
   a detector configured to generate one or more loop control signals based on comparing a reference clock signal to a feedback clock signal;
   a loop filter having a loop voltage that is adjusted based on the one or more loop control signals; and
   a gap detection and compensation circuit configured to process the one or more loop control signals to detect a gap in at least one of the reference clock signal or the feedback clock signal, and to modify the one or more loop control signals to provide an adjustment to the loop voltage in response to detecting the gap.

2. The timing alignment system of claim 1, further comprising a charge pump configured to charge or discharge the loop filter based on the one or more loop control signals.

3. The timing alignment system of claim 1, wherein the one or more loop control signals includes an up signal configured to increase the loop voltage and a down signal configured to decrease the loop voltage.

4. The timing alignment system of claim 3, wherein the gap detection and compensation circuit has a detection delay in which the down signal activates in response to the gap, wherein the gap detection and compensation circuit activates the up signal for a period of time that is based on the detection delay.

5. The timing alignment system of claim 3, further comprising an up current source configured to source an up current into the loop filter based on the up signal, and a down current source configured to sink a down current from the loop filter based on the down signal.

6. The timing alignment system of claim 1, wherein the detector is a phase-frequency-detector (PFD).

7. The timing alignment system of claim 1, further comprising a controllable delay line configured to generate the feedback clock signal based on delaying the reference clock signal by a delay that changes based on the loop voltage.

8. The timing alignment system of claim 1, further comprising a controllable oscillator having an oscillation frequency that changes based on the loop voltage.

9. The timing alignment system of claim 1, further comprising a reset control logic circuit configured to reset the detector after the gap detection and compensation circuit provides the adjustment to the loop voltage.

10. The timing alignment system of claim 1, wherein the gap detection and compensation circuit is configured to detect the gap in the reference clock signal.

11. The timing alignment system of claim 1, wherein the gap detection and compensation circuit is configured to detect the gap in the feedback clock signal.

12. A method of gap detection and compensation in a timing alignment system, the method comprising:
generating one or more loop control signals based on comparing a reference clock signal to a feedback clock signal using a detector;
adjusting a loop voltage of a loop filter based on the one or more loop control signals; and
processing the one or more loop control signals using a gap detection and compensation circuit to detect a gap in at least one of the reference clock signal or the feedback clock signal, and modifying the one or more loop control signals to provide an adjustment to the loop voltage in response to detecting the gap.

13. The method of claim 12, further comprising charging or discharging the loop filter based on the one or more loop control signals using a charge pump.

14. The method of claim 12, wherein the one or more loop control signals includes an up signal configured to increase the loop voltage and a down signal configured to decrease the loop voltage.

15. The method of claim 14, wherein the gap detection and compensation circuit has a detection delay in which the down signal activates in response to the gap, wherein the method further comprises using the gap detection and compensation circuit to activate the up signal for a period of time that is based on the detection delay.

16. The method of claim 12, further comprising controlling a delay of a controllable delay line based on the loop voltage, and generating the feedback clock signal based on delaying the reference clock signal using the controllable delay line.

17. The method of claim 12, further comprising controlling an oscillation frequency of a controllable oscillator based on the loop voltage.

18. The method of claim 12, further comprising generating an output clock signal based on the loop voltage, dividing the output clock signal to generate the feedback signal, and dividing an input clock signal to generate the reference clock signal.

19. The method of claim 12, further comprising resetting the detector after providing the adjustment to the loop voltage.

20. A time of flight system comprising:
a receiver configured to provide a reference clock signal;
a delay-locked loop configured to generate an output clock signal based on the reference clock signal, the delay-locked loop including a detector configured to generate one or more loop control signals based on comparing the reference clock signal to a feedback clock signal, a loop filter having a loop voltage that is adjusted based on the one or more loop control signals, a gap detection and compensation circuit configured to process the one or more loop control signals to detect a gap in at least one of the reference clock signal or the feedback clock signal, and to modify the one or more loop control signals to provide an adjustment to the loop voltage in response to detecting the gap; and
a driver circuit configured to generate a driver signal based on the output clock signal.

* * * * *